United States Patent
Takamatsu et al.

(10) Patent No.: US 10,074,457 B2
(45) Date of Patent: Sep. 11, 2018

(54) DIELECTRIC MATERIAL FOR TRANSDUCER, METHOD FOR MANUFACTURING THE SAME, AND TRANSDUCER INCLUDING THE SAME

(71) Applicant: Sumitomo Riko Company Limited, Aichi-ken (JP)

(72) Inventors: Shigeaki Takamatsu, Aichi-ken (JP); Shinji Kumagai, Aichi-ken (JP)

(73) Assignee: SUMITOMO RIKO COMPANY LIMITED, Aichi-Ken (JP)

(*) Notice: Subject to any disclaimer, the term of this patent is extended or adjusted under 35 U.S.C. 154(b) by 0 days.

(21) Appl. No.: 15/190,757

(22) Filed: Jun. 23, 2016

(65) Prior Publication Data
US 2016/0300640 A1   Oct. 13, 2016

Related U.S. Application Data

(63) Continuation of application No. PCT/JP2015/077509, filed on Sep. 29, 2015.

(30) Foreign Application Priority Data

Sep. 30, 2014 (JP) .................. 2014-200136

(51) Int. Cl.
*C08L 63/00* (2006.01)
*H01B 3/28* (2006.01)
(Continued)

(52) U.S. Cl.
CPC ............. *H01B 3/28* (2013.01); *B06B 1/0662* (2013.01); *C08K 3/22* (2013.01); *C08L 15/005* (2013.01);
(Continued)

(58) Field of Classification Search
CPC .... C08K 3/22; H01B 3/28; H01B 3/40; C08L 21/00; C08L 15/005; C08L 2203/20;
(Continued)

(56) References Cited

U.S. PATENT DOCUMENTS

2002/0192476 A1   12/2002   Kambe et al.
2009/0281224 A1   11/2009   Koh et al.
(Continued)

FOREIGN PATENT DOCUMENTS

| JP | 2000-072883 A | 3/2000 |
| JP | 2004-111400 A | 4/2004 |
| JP | 2007-027101 A | 2/2007 |
| JP | 2008-034189 A | 2/2008 |
| JP | 2012-072268 A | 4/2012 |
| JP | 2013-072063 A | 4/2013 |

(Continued)

OTHER PUBLICATIONS

Kokubo et al., JP 2012-072268 A machine translation in English, Apr. 12, 2012 (Year: 2012).*

(Continued)

*Primary Examiner* — David T Karst
(74) *Attorney, Agent, or Firm* — Greenblum & Bernstein, P.L.C.

(57) ABSTRACT

A dielectric material for a transducer is manufactured from a composition that includes metal oxide particles having hydroxy groups, a rubber polymer having a functional group capable of reacting with an epoxy group, a bisphenol type epoxy resin, both ends of which have an epoxy group, and a cross-linking agent. In the dielectric material for a transducer, the metal oxide particles are bound to the rubber polymer via the bisphenol type epoxy resin. A transducer includes a dielectric layer made of the dielectric material for a transducer and a plurality of electrodes arranged with the dielectric layer interposed therebetween.

11 Claims, 4 Drawing Sheets

(51) Int. Cl.
  *C08K 3/22* (2006.01)
  *C08L 21/00* (2006.01)
  *H02N 11/00* (2006.01)
  *H04R 19/02* (2006.01)
  *B06B 1/06* (2006.01)
  *C08L 15/00* (2006.01)
  *H01B 3/40* (2006.01)
  *H01L 41/37* (2013.01)
  *H01L 41/18* (2006.01)
  *H04R 17/00* (2006.01)

(52) U.S. Cl.
  CPC ............... *C08L 21/00* (2013.01); *H01B 3/40* (2013.01); *H01L 41/183* (2013.01); *H01L 41/37* (2013.01); *H02N 11/00* (2013.01); *H04R 19/02* (2013.01); *C08L 2203/20* (2013.01); *H04R 17/005* (2013.01)

(58) Field of Classification Search
  CPC ...... H02N 11/00; H04R 19/02; H04R 17/005; B06B 1/0662; H01L 41/37; H01L 41/183
  USPC .......................................... 523/400; 525/523
  See application file for complete search history.

(56) References Cited

U.S. PATENT DOCUMENTS

2011/0300393 A1  12/2011  Iio et al.
2013/0056249 A1   3/2013  Taguchi et al.
2013/0293062 A1  11/2013  Takamatsu et al.

FOREIGN PATENT DOCUMENTS

WO   2012/108502 A1   8/2012
WO   2013/047311 A1   4/2013

OTHER PUBLICATIONS

International Search Report issued with respect to Application No. PCT/JP2015/077509, dated Oct. 27, 2015.
Japanese Office Action issued issued with respect to Application No. 2014-200136, dated Jan. 26, 2016.
English translation of the written opinion of the International Searching Authority issued with respect to application No. PCT/JP2015/077509, dated Dec. 1, 2016.
European Search Report issued with respect to Application No. PCT/JP2015/077509, dated May 4, 2017, 5 pages.

* cited by examiner

[FIG. 1]
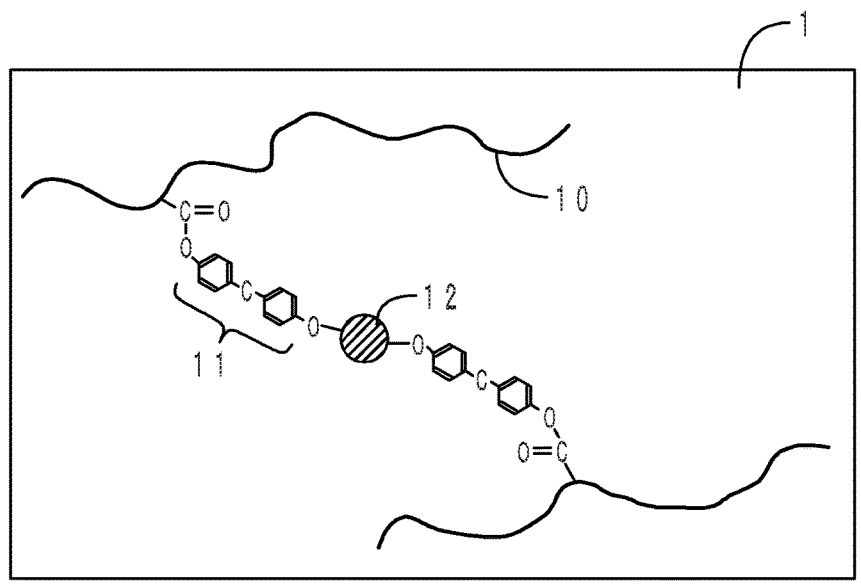
[FIG. 2]
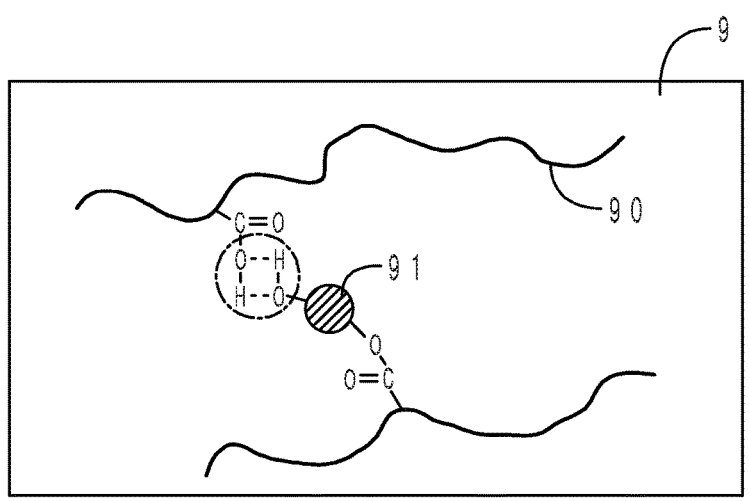

[FIG. 3A]
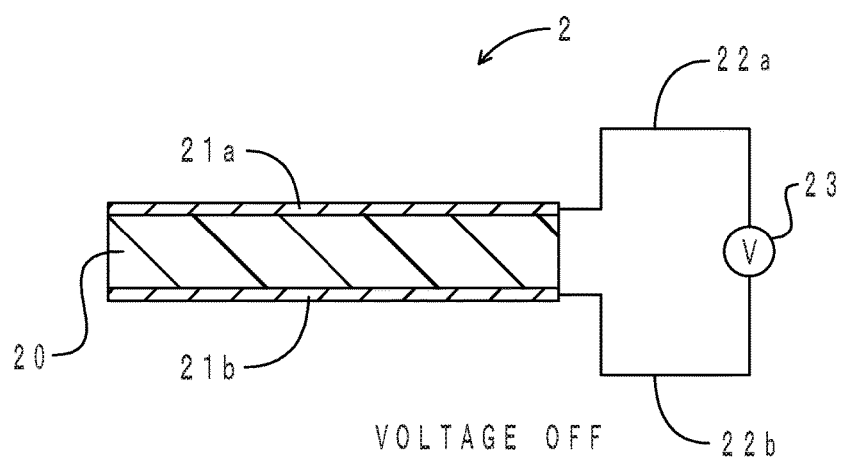
[FIG. 3B]
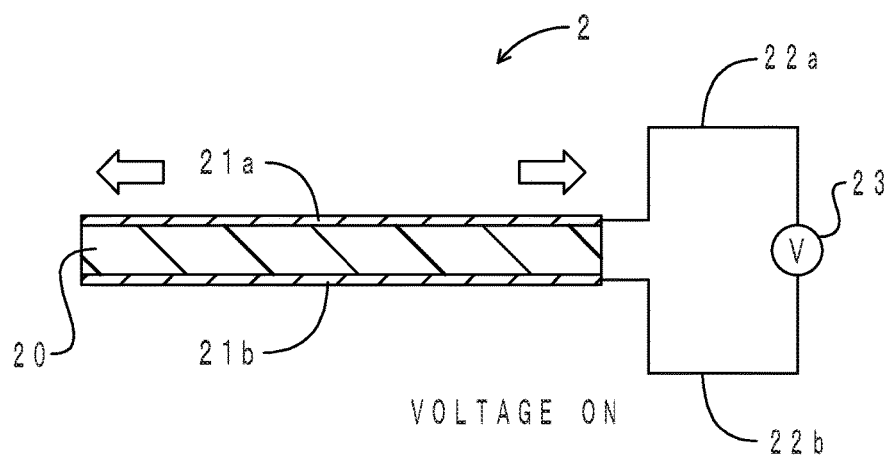

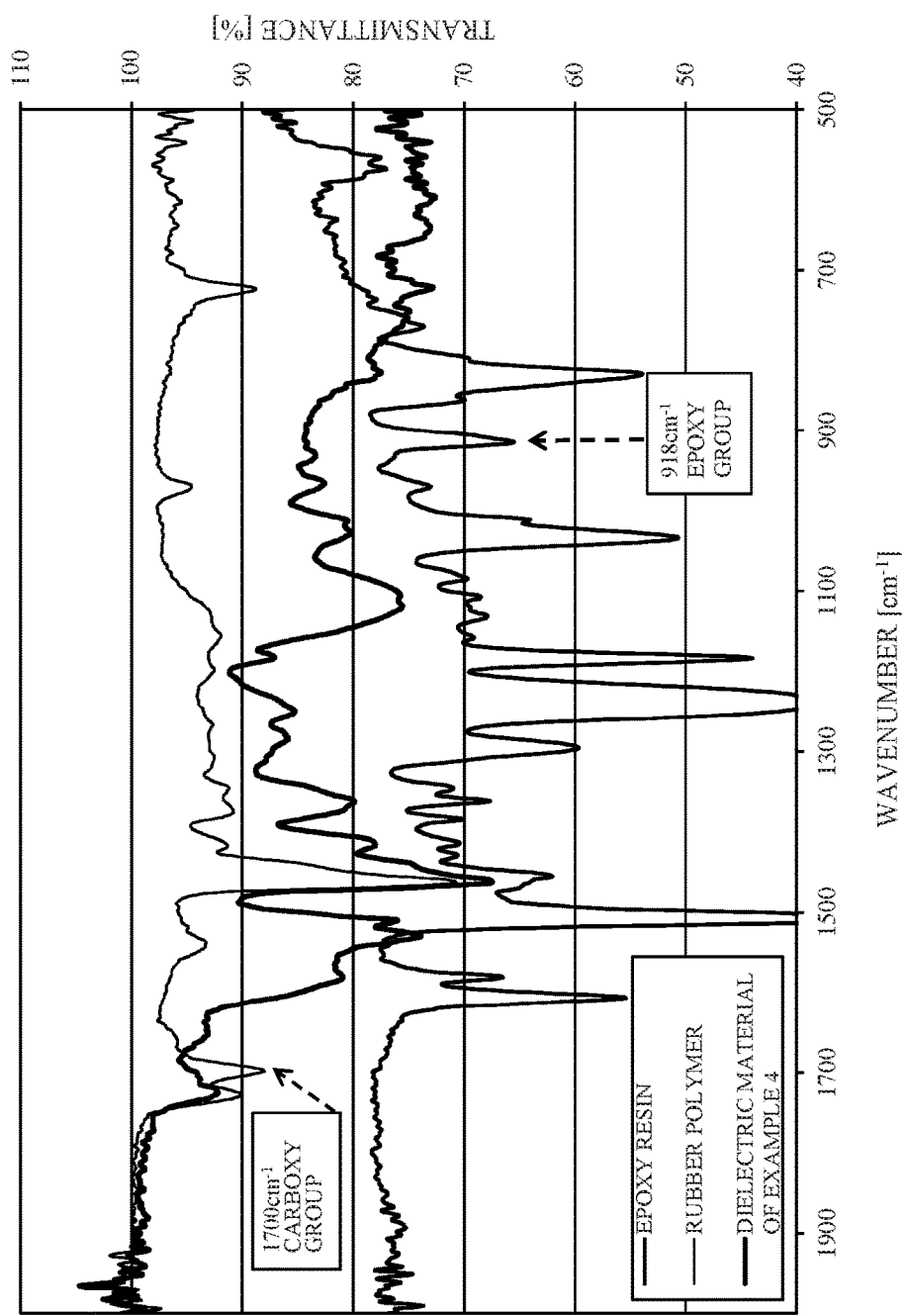
[FIG. 4]

[FIG. 5]
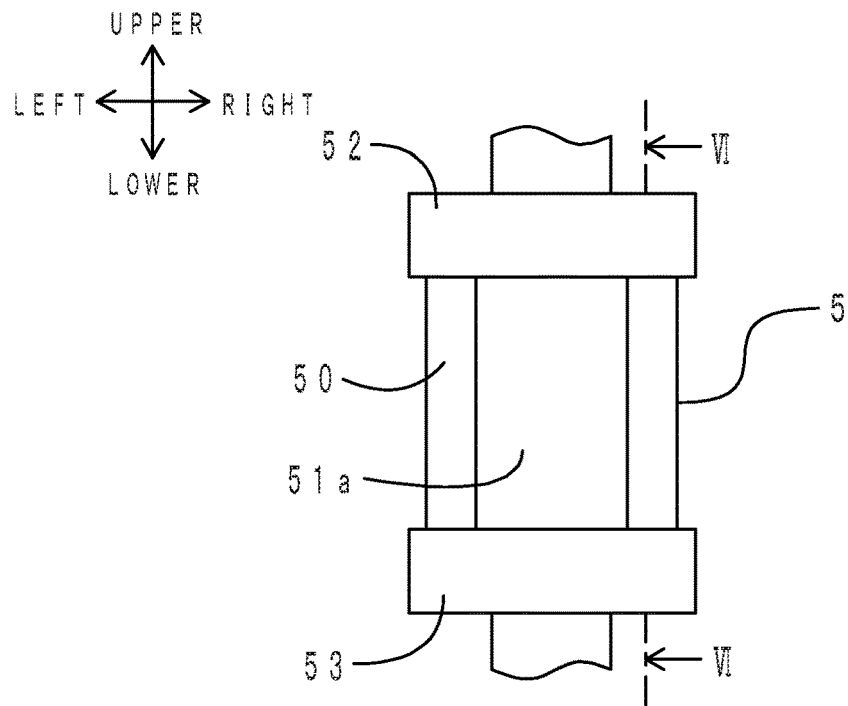
[FIG. 6]
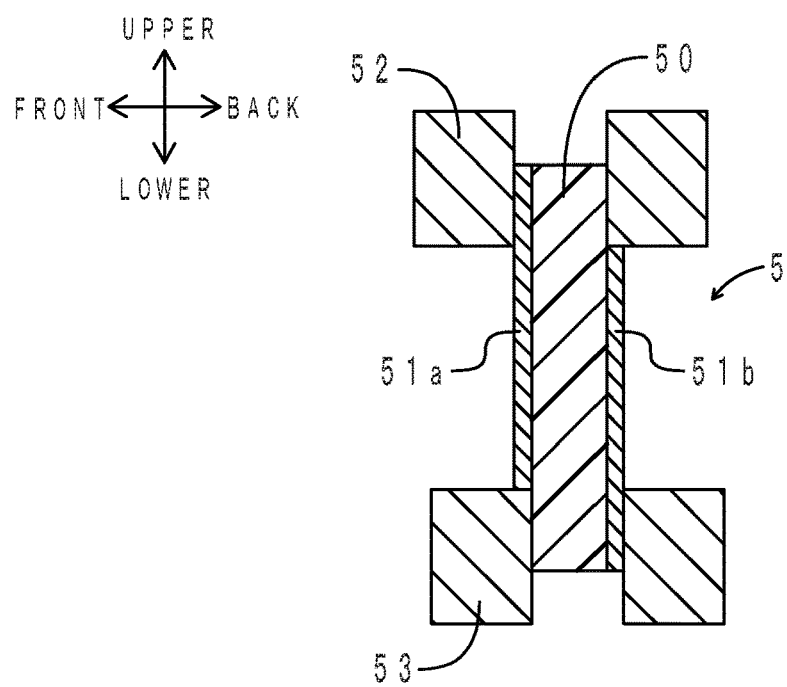

DIELECTRIC MATERIAL FOR TRANSDUCER, METHOD FOR MANUFACTURING THE SAME, AND TRANSDUCER INCLUDING THE SAME

CLAIM FOR PRIORITY

This application is a Continuation of PCT/JP2015/077509 filed Sep. 29, 2015, and claims the priority benefit of Japanese application 2014-200136 filed Sep. 30, 2014, the contents of which is expressly incorporated by reference herein in its entirety.

BACKGROUND OF THE INVENTION

1. Field of the Invention

The present invention relates to a dielectric material for use in a transducer such as an actuator and a speaker, and a method for manufacturing the dielectric material. Furthermore, the present invention relates to a transducer including a dielectric layer made of the dielectric material.

2. Description of Related Art

Transducers are known that perform conversion between mechanical energy and electric energy such as actuators and sensors, or that perform conversion between acoustic energy and electric energy such as speakers and microphones. In order to constitute a highly flexible, compact and light-weight transducer, polymer materials such as dielectric elastomers are useful.

For example, an actuator can be constituted by arranging a pair of electrodes on both sides in the thickness direction of a dielectric layer made of an elastomer. In the actuator of this type, when a higher voltage is applied between the electrodes, an electrostatic attraction between the electrodes increases. This compresses the dielectric layer interposed between the electrodes in the thickness direction, and the thickness of the dielectric layer decreases. When the dielectric layer becomes thinner, it extends accordingly in the direction parallel to the surfaces of the electrodes. On the contrary, when a lower voltage is applied between the electrodes, the electrostatic attraction between the electrodes decreases. This decreases a compressive force to the dielectric layer in the thickness direction, and the thickness of the dielectric layer increases due to its elastic restoring force. When the dielectric layer becomes thicker, it contracts accordingly in the direction parallel to the surfaces of the electrodes. In such a manner, the actuator drives a member to be driven by the expansion and contraction of the dielectric layer.

In order to increase a force and displacement output from the actuator by applying a high voltage, the dielectric layer preferably has high volume resistivity and high dielectric breakdown resistance. For example, Patent Document 1 describes a dielectric material in which metal oxide nanoparticles are chemically bound to an elastomer and are dispersed in the elastomer. Patent Document 2 describes a dielectric material that is manufactured by using a rubber polymer and an alkoxysilane-modified epoxy resin. In the dielectric material described in Patent Document 2, silica is produced from alkoxysilane of the alkoxysilane-modified epoxy resin during manufacture, and epoxy groups are bound to the rubber polymer. The dielectric material thereby has a structure in which the epoxy resin and silica are incorporated in a cross-linked structure of the rubber polymer.

[Patent Document 1] Japanese Patent Application Publication No. 2013-72063 (JP 2013-72063 A)
[Patent Document 2] Japanese Patent Application Publication No. 2012-72268 (JP 2012-72268 A)
[Patent Document 3] Japanese Patent Application Publication No. 2008-034189 (JP 2008-034189 A)
[Patent Document 4] Japanese Patent Application Publication No. 2004-111400 (JP 2004-111400 A)
[Patent Document 5] Japanese Patent Application Publication No. 2007-027101 (JP 2007-027101 A)

SUMMARY OF THE INVENTION

In the dielectric materials described in Patent Documents 1, 2, the metal oxide particles are incorporated in the cross-linked structure of the rubber polymer. This increases electric resistance of the dielectric materials and improves dielectric breakdown resistance. However, after studies by the present inventors, it has been found that conventional dielectric materials may undergo a breakdown when a voltage continues to be applied at a high temperature such as about 80° C. The reasons for this are considered as follows. A dielectric material usually contains a small amount of ionic components. When the dielectric material is exposed to high temperatures, molecular motion becomes active and the ionic components move more easily. This decreases the electric resistance of the dielectric material. In other words, when a voltage is applied, an electric current flows through the dielectric material more easily (this means that a leak current increases). Thus, when a voltage is applied at high temperatures, the leak current causes the generation of a large amount of Joule's heat within the dielectric material, and accordingly, the dielectric material is more susceptible to a breakdown. When large particles with a large particle diameter, such as agglomerates, are present in the dielectric material, they may serve as starting points for the occurrence of defects. This also becomes one factor of the breakdown of the dielectric material. Therefore, it is an object to improve the durability of the dielectric material for a transducer at high temperatures.

The present invention was made in light of such circumstances, and it is an object thereof to provide a dielectric material that is preferable as a dielectric layer of a transducer and excellent in durability at high temperatures, and a method for manufacturing the dielectric material. It is another object to provide a transducer that can be used for a long period of time even at high temperatures, and thus is excellent in durability.

(1) A dielectric material for a transducer according to the present invention is characterized in that the dielectric material is manufactured from a composition that includes metal oxide particles having hydroxy groups, a rubber polymer having a functional group capable of reacting with an epoxy group, a bisphenol type epoxy resin, both ends of which have an epoxy group, and a cross-linking agent, and the metal oxide particles are bound to the rubber polymer via the bisphenol type epoxy resin.

For the dielectric material for a transducer according to the present invention (hereinafter appropriately referred to as "the dielectric material according to the present invention"), an epoxy resin of a telechelic polymer, namely an epoxy resin, both ends of which have an epoxy group, is used as a raw material. One of the two epoxy groups at both ends reacts with the functional group of the rubber polymer, and the other reacts with the hydroxy group of the metal oxide particle. By these means, the epoxy resin is covalently bound to both the rubber polymer and the metal oxide particle.

FIG. 1 schematically illustrates a structure of the dielectric material according to the present invention. For comparison, FIG. 2 schematically illustrates a structure of the conventional dielectric material described in Patent Document 1 mentioned above. As illustrated in FIG. 1, in a dielectric material 1, a rubber polymer 10 and a bisphenol type epoxy resin 11 are covalently bound. A metal oxide particle 12 and the bisphenol type epoxy resin 11 are also covalently bound. Thus, the metal oxide particle 12 is bound to the rubber polymer 10 via the bisphenol type epoxy resin 11. On the contrary, as illustrated in FIG. 2, in the conventional dielectric material 9, a rubber polymer 90 and a metal oxide particle 91 are directly bound to each other and not via the epoxy resin. A portion of the bond is hydrogen bonding as illustrated by being surrounded by an alternate long and short dash line in FIG. 2.

In the dielectric material according to the present invention, both of the bond between the epoxy resin and the rubber polymer and the bond between the epoxy resin and the metal oxide particle are covalent bonds. Consequently, the bonds in the dielectric material according to the present invention have higher binding energy than the bonds between the rubber polymer and the metal oxide particle in the conventional dielectric material. In other words, the bonding strength of the rubber polymer-epoxy resin-metal oxide particle is high in the dielectric material according to the present invention.

The epoxy resin interposed between the rubber polymer and the metal oxide particle is of a bisphenol type. The bisphenol type epoxy resin is rigid as it has a structure in which benzene rings are arranged in a straight chain. The modulus of elasticity of the dielectric material increases by containing the rigid component. Since the bonding strength of the rubber polymer-epoxy resin-metal oxide particle is high and the rigid component such as a bisphenol structure is contained in the dielectric material according to the present invention, molecular movements are suppressed not only at room temperature but also at high temperatures. Thus, it is difficult for ionic components contained in the dielectric material to move. This suppresses the decrease in electric resistance at high temperatures. Even when a voltage is applied at high temperatures, Joule's heat is not generated easily within the dielectric material and it is less likely that the dielectric material undergoes a breakdown. Therefore, the dielectric material according to the present invention has excellent durability at high temperatures.

In the dielectric material according to the present invention, the metal oxide particles to be blended are bound to the rubber polymer by the binding to the epoxy resin. This reduces the agglomeration of the metal oxide particles, and allows the metal oxide particles to be uniformly dispersed in a base material made of the cross-linked rubber. The dielectric material according to the present invention thus has high uniformity so that it is less likely to undergo a breakdown and has excellent durability.

The dielectric material described in Patent Document 2 mentioned above is manufactured by using the alkoxysilane-modified epoxy resin, and the alkoxysilane-modified epoxy resin and the rubber polymer are bound to each other and silica is produced by a sol-gel reaction of alkoxysilane during manufacture. The dielectric material according to the present invention is different from the dielectric material of Patent Document 2 in that the metal oxide particles in addition to the epoxy resin are blended, and one of the epoxy groups at the ends of the epoxy resin is bound to the rubber polymer and the other epoxy group is bound to the metal oxide particle. In the dielectric material described in Patent Document 2, the alkoxysilane-modified epoxy resin agglomerates and tends to be large insulating particles present within the cross-linked rubber of a base material. This leads to low uniformity of the dielectric material, and cannot satisfy durability at high temperatures.

Patent Document 3 mentioned above describes a high dielectric film for a film capacitor. The high dielectric film is manufactured from a coating composition including a thermoplastic polymer such as a polycarbonate and a cellulose, inorganic ferroelectric particles and an affinity improver. The base material of the high dielectric film described in Patent Document 3 is not a cross-linked rubber but a polycarbonate or a cellulose. Thus, the high dielectric film lacks in flexibility and is not suitable for a dielectric layer of a transducer. In Patent Document 3, an epoxy compound is mentioned as the affinity improver. However, the epoxy compound mentioned is simply a compound of low molecular weight with only one epoxy group in order to increase an affinity between the thermoplastic polymer and the inorganic ferroelectric particles. The inorganic ferroelectric particles used in Examples have a perovskite structure, and hardly have hydroxy groups. Thus, it is considered that the reactivity with the epoxy compound is low. Similarly, it is considered that the thermoplastic polymer also does not react with the epoxy compound.

Patent Documents 4, 5 mentioned above describe thin-film dielectrics for use in a capacitor mounted on a module substrate. In the dielectrics described in Patent Documents 4, 5, an epoxy resin instead of a cross-linked rubber is used for a base material. Thus, the dielectrics lack in flexibility, and are not suitable for a dielectric layer of a transducer.

(2) A method for manufacturing a dielectric material for a transducer in order to manufacture the dielectric material according to the present invention mentioned above includes the steps of: adding a chelating agent to an organometallic compound to produce a chelate compound of the organometallic compound; adding an organic solvent and water to the chelate compound and heating the mixture to obtain a sol of metal oxide particles produced by a hydrolysis reaction of the organometallic compound; preparing a liquid composition including the sol of the metal oxide particles, a rubber polymer having a functional group capable of reacting with an epoxy group, a bisphenol type epoxy resin, both ends of which have an epoxy group, and a cross-linking agent; and applying the liquid composition to a substrate and curing a coating film.

In the manufacturing method according to the invention, the sol of the metal oxide particles produced by the hydrolysis reaction of the organometallic compound is used to manufacture the dielectric material according to the present invention. First, in the chelating process, the organometallic compound as a raw material is chelated by using the chelating agent. The organometallic compound undergoes hydrolysis and polycondensation (sol-gel reaction) by reacting with water. Chelating the organometallic compound in advance suppresses a rapid reaction between the organometallic compound and water in the subsequent process, and allows manufacture of metal oxide particles with a small particle diameter without being agglomerated. Next, in the sol manufacturing process, the organic solvent and water are added to the chelate compound of the organometallic compound, and the mixture is then heated, thereby allowing the hydrolysis reaction to proceed. This allows the production of metal oxide particles having hydroxy groups (—OH). Then, in the liquid composition preparing process, a liquid composition including the sol of the metal oxide particles manufactured in the previous process, the rubber polymer, the bisphenol type epoxy resin, both ends of which have an epoxy group, and the cross-linking agent is prepared. The metal oxide particles in the sol have hydroxy groups capable of reacting with epoxy groups. The rubber polymer has functional groups capable of reacting with epoxy groups. Thus, in the following curing process, the rubber polymer is cross-linked and cured, one of the epoxy groups of the bisphenol type epoxy resin reacts with the hydroxy group of the metal oxide particle, the other epoxy group reacts with the functional group of the rubber polymer, and the metal oxide particle is thereby bound to the rubber polymer via the bisphenol type epoxy resin. Thus, the dielectric material according to the present invention can be manufactured easily by the manufacturing method according to the present invention.

(3) A transducer according to the present invention includes a dielectric layer made of the dielectric material according to the present invention and a plurality of electrodes arranged with the dielectric layer interposed therebetween.

The dielectric layer constituting the transducer according to the present invention is made of the dielectric material according to the present invention. As described above, the dielectric material according to the present invention has excellent durability at high temperatures. Thus, the transducer according to the present invention can be used for a long period of time at high temperatures. When a voltage is applied to the dielectric material according to the present invention at high temperatures, an electric current does not flow easily. Therefore, the transducer according to the present invention can accumulate a large amount of electric charges within the dielectric layer. This generates a large electrostatic attraction. As a result, even when used at high temperatures, the transducer according to the present invention can obtain large force and displacement.

BRIEF DESCRIPTION OF THE DRAWINGS

FIG. 1 is a schematic view illustrating a structure of a dielectric material according to the present invention;

FIG. 2 is a schematic view illustrating a structure of a conventional dielectric material;

FIGS. 3A and 3B are schematic sectional views of an actuator that is one embodiment of a transducer according to the present invention, in which FIG. 3A shows the actuator in the voltage off-state, and FIG. 3B shows the actuator in the voltage on-state;

FIG. 4 is an infrared absorption spectrum of a dielectric material of Example 4;

FIG. 5 is a front-side elevation view of an actuator mounted on a test device for a dielectric breakdown test; and FIG. 6 is a VI-VI sectional view of FIG. 5.

DESCRIPTION OF THE REFERENCE NUMERALS

1: dielectric material, 10: rubber polymer, 11: bisphenol type epoxy resin, 12: metal oxide particle.
2: actuator (Transducer), 20: dielectric layer, 21a, 21b: electrodes, 22a, 22b: wires, 23: power source.
5: actuator, 50: dielectric material, 51a, 51b: electrodes, 52: upper chuck, 53: lower chuck.

DETAILED DESCRIPTION OF THE EMBODIMENTS

Hereinafter, embodiments of a dielectric material, a method for manufacturing the dielectric material and a transducer according to the present invention will be described. The dielectric material, the method for manufacturing the dielectric material and the transducer according to the present invention are not limited to the embodiments below and may be carried out in various forms in which modifications, improvements, or the like that can be performed by those skilled in the art are made without departing from the scope of the present invention.

<Dielectric Material>

A dielectric material according to the present invention is manufactured from a composition that includes metal oxide particles having hydroxy groups, a rubber polymer having a functional group capable of reacting with an epoxy group, a bisphenol type epoxy resin, both ends of which have an epoxy group, and a cross-linking agent. In a manufacturing process, one of the two epoxy groups at the ends of the bisphenol type epoxy resin reacts with the functional group of the rubber polymer, and the other reacts with the hydroxy group of the metal oxide particle. Thus, the metal oxide particle is bound to the rubber polymer via the bisphenol type epoxy resin.

[Metallic Oxide Particles]

The metal oxide particles are bound to the bisphenol type epoxy resin when the hydroxy group of the metal oxide particle reacts with the epoxy group. In terms of high insulating properties, the metal oxide particles preferably contain one or more elements selected from titanium, zirconium, and silicon. Examples of the metal oxide particles include oxide particles of each element such as titanium dioxide ($TiO_2$), zirconium dioxide ($ZrO_2$), and silica ($SiO_2$), and composite particles of these ($TiO_2/ZrO_2$, $TiO_2/SiO_2$, and the like). The metal oxide particles contained in the dielectric material may be one kind, two kinds or more.

In consideration of dispersiveness in a base material and uniformity of the resulting dielectric material, the particle diameter of the metal oxide particles is preferably small. For example, the median diameter of the metal oxide particles is preferably 5 nm or more and 50 nm or less. The median diameter is more preferably 30 nm or less, and further preferably 20 nm or less. The particle diameter of the metal oxide particles can be measured through observation using a transmission electron microscope (TEM). Alternatively, the particle diameter may also be measured by a small-angle X-ray scattering method.

A method for manufacturing the metal oxide particles is not particularly limited. For example, the metal oxide particles can be manufactured by a hydrolysis reaction (a sol-gel process) or mechanochemical method of an organometallic compound, or the like. By the hydrolysis reaction of the organometallic compound, metal oxide particles with many hydroxy groups can be manufactured. A sol of the metal oxide particles is produced in the hydrolysis reaction of the organometallic compound. As will be described later in the manufacturing method, if a dielectric material is manufactured by using the sol of the metal oxide particles, it is estimated that the particle diameter of the resulting dielectric material is equal to the particle diameter of the metal oxide particles in the sol. For this reason, the particle diameter of the metal oxide particles in the sol may be adopted as the particle diameter of the metal oxide particles in the dielectric material. The particle diameter of the metal oxide particles in the sol can be measured by using a laser diffraction/scattering particle size/particle size distribution measuring apparatus manufactured by Nikkiso Co., Ltd. Alternatively, the particle diameter of the particles in the sol can also be measured through observation of a dried and solidified sol with a scanning electron microscope (SEM).

The content of the metal oxide particles may be appropriately determined by taking into account the volume resistivity and flexibility of the dielectric material. For example, the blended amount of the metal oxide particles is preferably 1 part by mass or more and 20 parts by mass or less with respect to 100 parts by mass of the rubber polymer. If the blended amount of the metal oxide particles is less than 1 part by mass, the effect of increasing electric resistance is small. In contrast, if the blended amount of the metal oxide particles exceeds 20 parts by mass, the effect of increasing electric resistance is saturated, and only the modulus of elasticity increases.

[Rubber Polymer]

For the rubber polymer, one having a functional group capable of reacting with the epoxy group of the bisphenol type epoxy resin is used. Examples of the functional group capable of reacting with the epoxy group include carboxy group (—COOH), hydroxy group (—OH), and amino group (—NH$_2$, —NHR, —NRR', wherein R, R' are hydrocarbon groups). The rubber polymer only needs to have one or more of these functional groups. One of the rubber polymers can be used alone, or two or more of them can be mixed for use.

In view of gaining larger displacement with a smaller applied voltage, a rubber polymer having high polarity, that is, a high dielectric constant is preferred. For example, a rubber polymer having a dielectric constant of 4 or more (at a measurement frequency of 100 Hz) is preferable. Examples of the rubber polymer having a high dielectric constant include nitrile rubber (NBR), hydrogenated nitrile rubber (H-NBR), and acrylic rubber (ACM). Therefore, it is preferable to use a rubber polymer modified by, for example, introducing functional groups, such as carboxy group-modified nitrile rubber, carboxy group-modified hydrogenated nitrile rubber and carboxy group-modified acrylic rubber.

[Bisphenol Type Epoxy Resin]

The type of the bisphenol type epoxy resin is not particularly limited as long as both ends of the epoxy resin have an epoxy group. Examples of the bisphenol type epoxy resin include a bisphenol A type epoxy resin of Formula (1) below as well as a bisphenol F type epoxy resin and a bisphenol AD type epoxy resin.

The epoxy equivalent of the bisphenol type epoxy resin is preferably 160 g/eq or more and 3,000 g/eq or less. The epoxy equivalent represents the grams of resin containing 1 gram equivalent of epoxy groups. If the epoxy equivalent is less than 160 g/eq, the amount of rigid components including a bisphenol structure is small due to low molecular weight of the epoxy resin. Thus, a relatively low blended amount by taking into account the flexibility of the dielectric material decreases a reinforcing effect, and is unable to sufficiently prevent electric resistance from decreasing at high temperatures. The epoxy equivalent is more preferably 180 g/eq or more. In contrast, if the epoxy equivalent exceeds 3,000 g/eq, the blended amount of the epoxy resin necessary to introduce a predetermined amount of epoxy groups increases. Thus, the modulus of elasticity of the dielectric material increases. The epoxy equivalent is more preferably 1,000 g/eq or less and further preferably 500 g/eq or less.

[Cross-Linking Agent]

The type of the cross-linking agent is not particularly limited. However, if sulfur is used as a cross-linking agent, unreacted sulfur, a vulcanization accelerator or the like, and a decomposition product of sulfur, the vulcanization accelerator or the like (reaction residues) often remain. These reaction residues are ionized and become one factor of decreasing the dielectric breakdown resistance of the dielectric material. Thus, in view of decreasing ionic components in the dielectric material, an organometallic compound is preferably used as a cross-linking agent. In such case, metal oxide particles produced from the organometallic compound are also dispersed in the cross-linked rubber. Consequently, this further increases the dielectric breakdown strength of the dielectric material.

The type of the organometallic compound is not particularly limited. Examples of the organometallic compound include metal alkoxide compounds, metal acylate compounds and metal chelate compounds. One selected from these compounds may be used alone, or two or more of them may be combined for use. The organometallic compound preferably contains one or more elements selected from titanium, zirconium, aluminum, silicon, boron, vanadium, manganese, iron, cobalt, germanium, yttrium, niobium, lanthanum, cerium, tantalum, tungsten and magnesium.

Examples of the metal alkoxide compounds include tetra-n-butoxy titanium, tetra-n-butoxy zirconium, tetra-n-butoxy silane, acetoalkoxyaluminum diisopropylate, tetra-i-propoxy titanium, tetraethoxysilane, tetrakis (2-ethylhexyloxy) titanium and titanium butoxide dimer. Examples of the metal acylate compounds include polyhydroxy titanium stearate and zirconium tributoxy monostearate. Examples of the metal chelate compounds include a titanium chelate compound such as titanium-diisopropoxy-bis (acetylacetonate), titanium-tetraacetylacetonate, titanium-dioctyloxy-bis (octylene glycolate), titanium-diisopropoxy-bis (ethylacetoacetate), titanium-diisopropoxy-bis (triethanolaminate) and titanium-dibutoxy-bis (triethanolaminate), and a zirconium chelate compound such as zirconium tetraacetylacetonate, zirconium tributoxymonoacetylacetonate, zirconium monobutoxyacetylacetonate-bis (ethylacetoacetate) and zirconium dibutoxy-bis (ethylacetoacetate).

[Other Components]

The dielectric material according to the present invention may contain other components in addition to the components described above. Examples of other components include reinforcing agents, plasticizers, antioxidants and colorants.

<Method for Manufacturing Dielectric Material>

A method for manufacturing a dielectric material according to the present invention includes a chelating process, a sol producing process, a liquid composition preparing process and a curing process. Hereinafter, each process will be described in order.

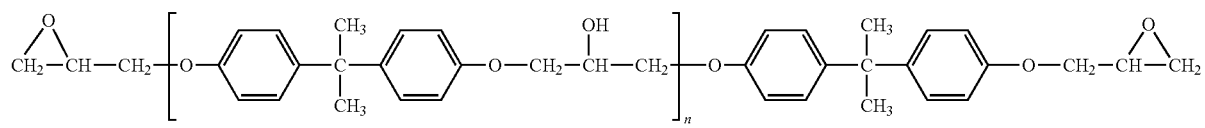

Formula (1)

[Chelating Process]

In the present process, a chelating agent is added to an organometallic compound to produce a chelate compound of the organometallic compound. For example, for manufacturing a sol of composite particles such as $TiO_2/ZrO_2$ or $TiO_2/SiO_2$, the plurality of organometallic compounds serving as raw materials of metal oxides that constitute the composite particles are mixed, and then the chelating agent may be added thereto. In this case, if heat treatment is performed before the addition of the chelating agent, the plurality of organometallic compounds can react in advance. Alternatively, an organometallic compound serving as a raw material of one metal oxide that constitutes the composite particles is chelated in the present process, and in the following sol producing process, other organometallic compound serving as a raw material of other metal oxide may be added to the chelate compound.

The organometallic compound may be appropriately selected from metal alkoxide compounds and metal acylate compounds depending on the type of desired metal oxide particles. Examples of the metal alkoxide compounds include tetra-n-butoxy titanium, tetra-n-butoxy zirconium, tetra-n-butoxy silane, tetra-i-propoxy titanium, tetraethoxysilane, tetrakis (2-ethylhexyloxy) titanium and titanium butoxide dimer. Examples of the metal acylate compounds include polyhydroxy titanium stearate and zirconium tributoxy monostearate.

Examples of the chelating agent include β-diketones such as acetylacetone, benzoyl acetone and dibenzoylmethane, β-keto acid esters such as ethyl acetoacetate and ethyl benzoylacetate, triethanolamine, lactic acid, 2-ethylhexane-1,3-diol and 1,3-hexanediol. The chelating agent is preferably the same as a solvent for dissolving a rubber polymer in the liquid composition preparing process described below.

[Sol Producing Process]

In the present process, an organic solvent and water are added to the produced chelate compound and heat treatment is performed to obtain a sol of metal oxide particles produced by a hydrolysis reaction of the organometallic compounds. In the present process, the hydrolysis reaction of the organometallic compounds progresses to produce the metal oxide particles.

For the organic solvent, alcohols such as methanol, ethanol and isopropyl alcohol (IPA), ketones such as methyl ethyl ketone (MEK) and methyl isobutyl ketone (MIBK), and ethers such as tetrahydrofuran (THF) may be used. For example, addition of IPA improves the affinity between the chelate compound and water, thereby allowing nuclei of the metal oxide particles to be produced easily. Addition of MEK can improve the compatibility between the sol of the metal oxide particles and a polymer solution in the following liquid composition preparing process. The particle diameter of the metal oxide particles to be produced changes depending on the type and an amount of organic solvent to be used. For example, in order to produce metal oxide particles having a median diameter of approximately 10 nm to 50 nm, IPA and MEK are preferably added such that the number of moles of IPA/the number of moles of MEK=approximately 0.6, and the amount of IPA to be added is preferably 7 times to 10 times the number of moles of the organometallic compounds used. Water may be added in an amount necessary for the hydrolysis reaction of the organometallic compounds. The heat treatment is performed by leaving the sol standing still at a temperature of approximately 40° C. for 1 hour to a few hours.

[Liquid Composition Preparing Process]

In the present process, a liquid composition including the produced sol of the metal oxide particles, a rubber polymer having a functional group capable of reacting with an epoxy group, a bisphenol type epoxy resin, both ends of which have an epoxy group, and a cross-linking agent is prepared.

The liquid composition can be prepared, for example, by dissolving the rubber polymer in a solvent, adding the sol of the metal oxide particles, the bisphenol type epoxy resin, the cross-linking agent, and the like to the solution, and stirring the mixture. The solvent used is preferably the same as the chelating agent chelating the organometallic compounds. The amount of sol to be blended may be appropriately determined in accordance with the amount of metal oxide particles to be contained. The liquid composition may be blended with other components as needed.

The cross-linking agent is preferably an organometallic compound. The reaction residue of the cross-linking agent becomes impurities and one factor of decreasing the dielectric breakdown resistance of the dielectric material. Use of the organometallic compound makes the reaction residue less likely to remain, thereby suppressing the decrease in the dielectric breakdown strength of the dielectric material. In view of reducing the amount of impurities of the dielectric material, the solution prepared by dissolving the rubber polymer in the solvent and the prepared liquid composition are preferably filtered.

[Curing Process]

In the present process, the prepared liquid composition is applied to a substrate, and the resulting coating film is cured. A method for applying the liquid composition is not particularly limited. Examples of the method include printing methods such as ink-jet printing, flexographic printing, gravure printing, screen printing, pad printing and lithography, a dip method, a spray method, and a bar-coating method. The curing temperature of the coating film may be appropriately determined by taking into account the type of the solvent used and a reaction rate. The curing temperature is preferably set at the boiling point of the solvent or above, for example.

<Transducer>

A transducer according to the present invention includes a dielectric layer made of the dielectric material according to the present invention and a plurality of electrodes arranged with the dielectric layer interposed therebetween. The composition and the manufacturing method of the dielectric material according to the present invention are as described above, and the description thereof will be omitted in this section. Also in the transducer according to the present invention, a preferable embodiment of the dielectric material according to the present invention is preferably employed.

The thickness of the dielectric layer may be appropriately determined depending on its application and the like. For example, if the transducer according to the present invention is used as an actuator, the thickness of the dielectric layer is preferably small in terms of achieving compact size, low potential driving and large displacement of the actuator. In this case, also taking into account the dielectric breakdown resistance and the like, the thickness of the dielectric layer is preferably set to be 1 μm or more and 1,000 μm (1 mm) or less. More preferable range is 5 μm or more and 200 μm or less.

In the transducer according to the present invention, the material of the electrodes is not particularly limited. The electrodes are preferably expandable and contractible in accordance with the deformation of the dielectric layer. In this case, because the deformation of the dielectric film is less likely to be restricted by the electrodes, a desired output is likely to be gained. For example, the electrodes may be formed from conductive paint prepared by mixing a conductive material into a binder such as oil and an elastomer. Examples of the conductive material include a carbon material such as carbon black, ketjen black, a carbon nanotube and graphene, and metallic powder of silver or the like. Also, carbon fibers or metallic fibers may be knit in mesh to form the electrodes.

When the transducer according to the present invention has a stacked structure formed by alternately stacking the plurality of dielectric layers and the electrodes, a larger force can be generated. Thus, if the stacked structure is employed, the output of the actuator can be increased, for example. In this manner, a member to be driven can be driven by a larger force.

The following describes an embodiment in which the transducer according to the present invention is embodied as an actuator. FIG. 3 shows sectional schematic views of the actuator of the present embodiment. FIG. 3A illustrates a voltage OFF state, and FIG. 3B illustrates a voltage ON state.

As illustrated in FIG. 3, an actuator 2 includes a dielectric layer 20, electrodes 21a, 21b and wires 22a, 22b. The dielectric layer 20 is made of the dielectric material according to the present invention including a carboxy group-modified hydrogenated nitrile rubber (HX-NBR) as a base material. In the dielectric material, titanium dioxide ($TiO_2$) particles having a median diameter of 10 nm are covalently bound to the polymer of HX-NBR via a bisphenol A type epoxy resin.

The electrode 21a is arranged so as to cover almost the entire upper surface of the dielectric layer 20. Similarly, the electrode 21b is arranged so as to cover almost the entire lower surface of the dielectric layer 20. The electrodes 21a, 21b are connected to a power source 23 through the wires 22a, 22b, respectively.

When the actuator is switched from an OFF state to an ON state, a voltage is applied between the electrodes 21a, 21b. The application of voltage makes the dielectric layer 20 thinner and extend accordingly in parallel to the surfaces of the electrodes 21a, 21b in the direction illustrated by the white arrow in FIG. 3B. As a result, the actuator 2 outputs a driving force in the vertical direction and the lateral direction in the drawing.

According to the present embodiment, the bonding strength of the polymer of HX-NBR-epoxy resin-$TiO_2$ particles is high in the dielectric material constituting the dielectric layer 20. Furthermore, since the epoxy resin contains a rigid component, the modulus of elasticity of the dielectric material is high. Furthermore, the $TiO_2$ particles are uniformly dispersed without being agglomerated, and the uniformity of the dielectric layer 20 is high. Thus, the dielectric layer 20 has high dielectric breakdown resistance and excellent durability at high temperatures. This permits long use of the actuator 2 at high temperatures, and thus, the actuator 2 is excellent in durability. When a voltage is applied to the dielectric layer 20 at high temperatures, a current does not flow easily. The actuator 2 therefore enables the dielectric layer 20 to accumulate therein a large amount of electric charges. This generates a large electrostatic attraction. As a result, even when used at high temperatures, the actuator 2 can obtain large force and displacement.

EXAMPLES

Next, the present invention will be more specifically described with reference to examples.

<Manufacture of Metallic Oxide Particles>

[$TiO_2$ Sol]

First, 0.02 mol of acetylacetone was added to 0.01 mol of tetra-i-propoxy titanium as an organometallic compound to perform chelating. Next, 0.083 mol of isopropyl alcohol (IPA), 0.139 mol of methyl ethyl ketone (MEK) and 0.04 mol of water were added to the obtained chelate compound. This mixture was left standing still at 40° C. for 2 hours to obtain a sol of titanium dioxide ($TiO_2$) particles. The manufactured sol is referred to as a $TiO_2$ sol. The median diameter of the $TiO_2$ particles contained in the $TiO_2$ sol was measured by using a laser diffraction/scattering particle size/particle size distribution measuring apparatus manufactured by Nikkiso Co., Ltd., and was 14 nm.

[$TiO_2/ZrO_2$ Sol]

First, 0.005 mol of zirconium alkoxide and 0.083 mol of IPA were added to 0.01 mol of tetra-i-propoxy titanium, and the mixture was left standing still at 60° C. for 2 hours. Next, 0.02 mol of acetylacetone, 0.139 mol of MEK and 0.04 mol of water were added thereto, and then the mixture was left standing still at 40° C. for 1 hour. 0.03 mol of acetic acid, 0.008 mol of vinyltrimethoxysilane ("KBM-1003" manufactured by Shin-Etsu Chemical Co., Ltd.) as a silane coupling agent and 0.024 mol of water were added thereto, and the mixture was left standing still at 70° C. for 6 hours. A sol of titanium dioxide/zirconium dioxide ($TiO_2/ZrO_2$) composite particles was thus obtained. The manufactured sol is referred to as a $TiO_2/ZrO_2$ sol. The median diameter of the $TiO_2/ZrO_2$ particles contained in the $TiO_2/ZrO_2$ sol was measured in the same manner as above, and was 10 nm.

Method for Manufacturing Dielectric Material

Examples 1 to 5

First, a carboxy group-modified hydrogenated nitrile rubber ("Therban (registered trademark) XT8889" manufactured by LANXESS) was dissolved in acetylacetone to prepare a polymer solution with solid concentration of 12% by mass. The prepared polymer solution was filtered. Next, 20.57 parts by mass of the $TiO_2$ sol, 5 parts by mass of an acetylacetone solution of tetrakis (2-ethylhexyloxy) titanium (concentration of 20% by mass) as a cross-linking agent, 1 part by mass of a bisphenol A type epoxy resin ("jER (registered trademark) 828" manufactured by Mitsubishi Chemical Corporation, epoxy equivalent of 189 g/eq), and 20 parts by mass of acetylacetone were added to the 100 parts by mass of the polymer solution, and the mixture was stirred. Furthermore, 14.346 parts by mass of the $TiO_2/ZrO_2$ sol were added thereto, and the mixture was stirred to prepare a liquid composition. The prepared liquid composition was filtered. The liquid composition is applied to a substrate and dried, and then heated at 150° C. for 1 hour to obtain a thin-film dielectric material. The manufactured dielectric material was referred to as a dielectric material of Example 1. Both ends of the bisphenol A type epoxy resin used have an epoxy group. In the dielectric material of Example 1, when the content of the metal oxide particles with respect to 100 parts by mass of the elastomer (HX-NBR) was calculated based on the amount of titanium (Ti) contained in the used sol, the content of the $TiO_2$ particles was 6.6 parts by mass, and the content of the $TiO_2/ZrO_2$ was 5.82 parts by mass.

Four types of dielectric materials were additionally manufactured in the same manner as the dielectric material of Example 1 except that the blended amount of the bisphenol A type epoxy resin was changed. The manufactured dielectric materials were referred to as dielectric materials of Examples 2 to 5.

A result of the analysis of the dielectric material of Example 4 with a Fourier transform infrared spectrophotometer (FT-IR) is shown. FIG. 4 illustrates an infrared absorption spectrum of the dielectric material of Example 4. In FIG. 4, the infrared absorption spectra of the rubber polymer (HX-NBR) and the bisphenol A type epoxy resin used are also shown for comparison.

As illustrated in FIG. 4, the absorption by epoxy groups appears at about 918 cm$^{-1}$ in the spectrum of the bisphenol A type epoxy resin, whereas no absorption is seen at about 918 cm$^{-1}$ in the spectrum of the dielectric material of Example 4. Furthermore, the absorption by carboxy groups appears at about 1700 cm$^{-1}$ in the spectrum of the rubber polymer, whereas no absorption is seen at about 1700 cm$^{-1}$ in the spectrum of the dielectric material of Example 4. Based on above, it can be confirmed that the epoxy groups and the carboxy groups in the dielectric material of Example 4 reacted.

Example 6

A dielectric material was manufactured in the same manner as the dielectric material of Example 5 except that the $TiO_2/ZrO_2$ sol was not blended. The manufactured dielectric material was referred to as a dielectric material of Example 6.

Example 7

A dielectric material was manufactured in the same manner as the dielectric material of Example 5 except that the $TiO_2/ZrO_2$ sol was not blended, and 10 parts by mass of a bisphenol F type epoxy resin ("jER (registered trademark) 806" manufactured by Mitsubishi Chemical Corporation, epoxy equivalent of 165 g/eq) instead of the bisphenol A type epoxy resin was blended. The manufactured dielectric material was referred to as a dielectric material of Example 7. Both ends of the bisphenol F type epoxy resin used have an epoxy group.

Comparative Example 1

A dielectric material was manufactured in the same manner as the dielectric material of Example 1 except that the $TiO_2/ZrO_2$ sol and the bisphenol A type epoxy resin were not blended. The manufactured dielectric material was referred to as a dielectric material of Comparative Example 1.

Comparative Example 2

A dielectric material was manufactured in the same manner as the dielectric material of Example 1 except that the bisphenol A type epoxy resin was not blended. The manufactured dielectric material was referred to as a dielectric material of Comparative Example 2.

Comparative Example 3

A dielectric material was manufactured in the same manner as the dielectric material of Example 1 except that the blended amount of the $TiO_2/ZrO_2$ sol was reduced to half, and a terpene resin ("TACKIROL (registered trademark) 1201MB35" manufactured by Taoka Chemical Co., Ltd.) instead of the bisphenol A type epoxy resin was blended. The manufactured dielectric material was referred to as a dielectric material of Comparative Example 3.

<Evaluation Methods of Dielectric Materials>

[Dielectric Constant]

The dielectric constant was measured by placing each of the dielectric materials in a sample holder (Type 12962A manufactured by Solartron), and using a dielectric constant measuring interface (Type 1296 manufactured by Solartron) and a frequency response analyzer (Type 1255B manufactured by Solartron) in combination (at frequency of 100 Hz).

[Tensile Properties]

The tensile strength at break, elongation at break, and tensile stress at 25% elongation ($M_{25}$) of each of the dielectric materials were measured pursuant to JIS K 6251: 2010. For a test piece, a dumbbell-shaped test piece No. 2 was used.

[Dielectric Breakdown Properties]

An actuator was manufactured using each of the manufactured dielectric materials, and a dielectric breakdown test was performed. First, carbon black was mixed with and dispersed in an acrylic rubber polymer solution to prepare conductive paint. The conductive paint was then screen-printed on both front and back faces of the manufactured dielectric material to form electrodes. The actuators manufactured in this manner were associated with the types of the dielectric materials and were referred to as an "actuator of Example 1" etc. The actuators of Examples 1 to 7 are included in the transducer according to the present invention.

Hereinafter, a method of the dielectric breakdown test will be described. FIG. 5 is a front-side elevation view of an actuator mounted on a test device. FIG. 6 is a VI-VI sectional view of FIG. 5.

As illustrated in FIGS. 5 and 6, the upper end of an actuator 5 is held by an upper chuck 52 of the test device. The lower end of the actuator 5 is held by a lower chuck 53. The actuator 5 extended at an elongation of 25% in advance in the up-down direction is set between the upper chuck 52 and the lower chuck 53.

The actuator 5 is made of a dielectric material 50 and a pair of electrodes 51a, 51b. The dielectric material 50 has the shape of a rectangular thin film of 50 mm long and 25 mm wide in a natural state. The electrodes 51a, 51b are arranged so as to face each other in the front and back direction with the dielectric material 50 interposed therebetween. Each of the electrodes 51a, 51b has the shape of a rectangular thin film of 40 mm long, 15 mm wide, and 10 µm thick in a natural state. The electrodes 51a, 51b are arranged so as to be offset from each other by 10 mm in the up-down direction. In other words, the electrodes 51a, 51b overlap, with the dielectric film 50 interposed therebetween, within a range of 30 mm long and 15 mm wide. A wire (not illustrated) is connected to the lower end of the electrode 51a. Similarly, a wire (not illustrated) is connected to the upper end of the electrode 51b. The electrodes 51a, 51b are connected to a power source (not illustrated) through the respective wires. When a voltage is applied between the electrodes 51a and 51b, an electrostatic attraction occurs between the electrodes 51a and 51b to compress the dielectric material 50. The dielectric film 50 therefore decreases in thickness and extends in an extension direction (the up-down direction).

First, a voltage of 10 V/µm was applied between the electrodes 51a and 51b at room temperature for 10 seconds followed by suspension of the voltage application for 15 seconds. This voltage application—suspension cycle was repeated while increasing the applied voltage by 10 V/µm.

The test was performed until the dielectric material 50 underwent a breakdown. The voltage value immediately before the breakdown of the dielectric material 50 was measured, and a value calculated by dividing the voltage value by the film thickness of the dielectric material 50 was set to be dielectric breakdown strength. An electric current that flew between the electrodes 51a and 51b when a voltage of 50 V/μm was applied was measured, and the value was set to be a leak current. Electric resistance when a voltage of 50 V/μm was applied was measured to calculate volume resistivity.

[Durability at High Temperature]

An energization test at high temperature was performed on each of the manufactured dielectric materials. A sample prepared as in the following way was used for the energization test. First, electrodes were formed on both front and back faces of the thin-film dielectric material in the same manner as the actuators used in the dielectric breakdown test. Next, a protective layer of silicone rubber is placed over the exterior of each of the electrodes at the front and the back such that the electrodes are not exposed. In the prepared sample, the electrodes overlap, with the dielectric film interposed therebetween, within a range of 70 mm square. The electrodes are connected to a power source through respective wires.

Hereinafter, a method of the energization test will be described. First, a sample was placed in a constant temperature oven of 80° C. and was left standing still there for 10 minutes. Next, a voltage was applied to the electrodes at a constant boosting rate such that the voltage reached 60 V/μm in 200 seconds. The energization was continued for maximum 2 hours with the applied voltage of 60 V/μm. When the dielectric material underwent the breakdown, the time was recorded. This energization test was performed 3 times.

<Evaluation Results of Dielectric Materials>

Table 1 shows the compositions and evaluation results of Examples 1 to 7 and Comparative Examples 1 to 3. In Table 1, the content of the metal oxide particles is a value calculated based on the amount of titanium (Ti) in the sol used (this is also applied to Table 2 below).

TABLE 1

| | | | Example 1 | Example 2 | Example 3 | Example 4 | Example 5 | Example 6 | Example 7 | Comparative Example 1 | Comparative Example 2 | Comparative Example 3 |
|---|---|---|---|---|---|---|---|---|---|---|---|---|
| Raw material [parts by mass] | Rubber polymer | HX-NBR | 100 | 100 | 100 | 100 | 100 | 100 | 100 | 100 | 100 | 100 |
| | Cross-linking agent | Tetrakis (2-ethylhexyloxy) titanium | 5 | 5 | 5 | 5 | 5 | 5 | 5 | 5 | 5 | 5 |
| | Metal oxide particles | $TiO_2$ particles | 6.6 | 6.6 | 6.6 | 6.6 | 6.6 | 6.6 | 6.6 | 6.6 | 6.6 | 6.6 |
| | | $TiO_2/ZrO_2$ composite particles | 5.82 | 5.82 | 5.82 | 5.82 | 5.82 | — | — | — | 5.82 | 2.91 |
| | Resin | Bisphenol A type epoxy resin | 1 | 2 | 3.5 | 5 | 10 | 10 | — | — | — | — |
| | | Bisphenol F type epoxy resin | — | — | — | — | — | — | 10 | — | — | — |
| | | Terpene resin | — | — | — | — | — | — | — | — | — | 5 |
| Film thickness [μm] | | | 6.9 | 8.3 | 7.9 | 8.2 | 7.0 | 6.8 | 7.2 | 8.4 | 7.6 | 6.5 |
| Evaluations | Dielectric constant (at frequency of 100 Hz) | | 11.74 | 12.83 | 11.70 | 11.60 | 11.17 | 12.00 | 11.32 | 11.97 | 12.00 | 11.66 |
| | Dielectric breakdown strength [V/μm] | | 110 | 130 | 120 | 140 | 160 | 120 | 120 | 80 | 120 | 110 |
| | Leak current [nA] | | 87 | 62 | 71 | 45 | 47 | 90 | 85 | 113 | 95 | 75 |
| | Volume resistivity [Ω·cm] | | $2.5 \times 10^{13}$ | $3.5 \times 10^{13}$ | $3.0 \times 10^{13}$ | $4.8 \times 10^{13}$ | $4.6 \times 10^{13}$ | $2.3 \times 10^{13}$ | $2.5 \times 10^{13}$ | $2.0 \times 10^{13}$ | $2.3 \times 10^{13}$ | $2.9 \times 10^{13}$ |
| | $M_{25}$ [MPa] | | 4.5 | 5.3 | 5.9 | 6.1 | 8.0 | 3.5 | 3.6 | 2.2 | 3.8 | 3.7 |
| | Tensile strength at break [MPa] | | 57.0 | 44.7 | 56.9 | 64.0 | 60.1 | 55.4 | 53.8 | 57.1 | 44.1 | 48.3 |
| | Elongation at break [%] | | 420 | 410 | 410 | 405 | 350 | 315 | 300 | 460 | 400 | 335 |
| | Energization test 80° C. 60 V/μm | No. 1 | 8 min. | 15 min. | >2 hours | >2 hours | >2 hours | >2 hours | >2 hours | 0.5 min. | 3 min. | — |
| | | No. 2 | 8 min. | 21 min. | >2 hours | >2 hours | >2 hours | >2 hours | >2 hours | 0.7 min. | 3 min. | — |
| | | No. 3 | 10 min. | 15 min. | >2 hours | >2 hours | >2 hours | >2 hours | >2 hours | 0.8 min. | 3 min. | — |

As shown in Table 1, the dielectric materials of Examples 1 to 5, in which the $TiO_2/ZrO_2$ particles were included and the epoxy resin was blended, had higher volume resistivity and smaller leak current than the dielectric material of Comparative Example 2, in which the $TiO_2/ZrO_2$ particles were included, but the epoxy resin was not blended. While the dielectric breakdown strength of the dielectric material of Example 1 was smaller than the dielectric breakdown strength of the dielectric material of Comparative Example 2, the dielectric breakdown strengths of the dielectric materials of Examples 2 to 5 were equal to or larger than the dielectric breakdown strength of the dielectric material of Comparative Example 2. When a comparison was made among the dielectric materials of Examples 1 to 5, it was seen that with the increase in the blended amount of epoxy resin, the dielectric breakdown strength and the volume resistivity tended to increase and the leak voltage decrease while the tensile stress ($M_{25}$) increased and the flexibility decreased.

The dielectric materials of Examples 6, 7, in which the $TiO_2/ZrO_2$ particles were not included and the epoxy resin was blended, had higher volume resistivity and dielectric breakdown strength and smaller leak current than the dielectric material of Comparative Example 1, in which the $TiO_2/ZrO_2$ particles were not included and the epoxy resin was not blended.

The dielectric material of Comparative Example 3, in which the terpene resin having no epoxy group at both ends was blended, had smaller volume resistivity and a smaller effect of improving dielectric breakdown properties than the dielectric material of Example 4, in which the bisphenol A type epoxy resin was blended with the same amount of terpene resin.

All of the dielectric materials of Examples 1 to 7 showed high durability at high temperature. In particular, the dielectric materials of Examples 3 to 7, in which the blended amount of the epoxy resin was 3.5 parts by mass or more, did not undergo breakdown even after being energized for 2 hours. This confirmed that the dielectric material according to the present invention has excellent durability at high temperature.

<Study of Epoxy Equivalent>

Six types of dielectric materials using three bisphenol A type epoxy resins of epoxy equivalents different from the epoxy equivalent of the bisphenol A type epoxy resin used in the dielectric materials of Examples 1 to 6 were manufactured. Then, the physical properties and characteristic properties of the dielectric materials were evaluated by evaluation methods similar to those mentioned above. The manufactured dielectric materials were referred to as dielectric materials of Examples 8 to 13. The bisphenol A type epoxy resins used were of the following three types, in each of which both ends have an epoxy group.

"jER1001": Epoxy equivalent 475 g/eq, manufactured by Mitsubishi Chemical Corporation
"jER1003": Epoxy equivalent 720 g/eq, manufactured by Mitsubishi Chemical Corporation
"jER1009": Epoxy equivalent 2,850 g/eq, manufactured by Mitsubishi Chemical Corporation Table 2 lists the compositions and evaluation results of Examples 8 to 13. For comparison, Table 2 also lists the composition and evaluation results of the dielectric material of Example 4 shown above.

In the dielectric materials of Examples 8 to 10, the blended amount of the epoxy resin was adjusted such that the amount of epoxy groups was equal to amount of epoxy groups in the epoxy resin blended in the dielectric material of Example 4. Thus, the higher the epoxy equivalent was, the larger the amount of epoxy resin blended was. As a result, the dielectric materials of Examples 8 to 10 had lower flexibility than the dielectric material of Example 4. On the contrary, in the dielectric materials of Examples 11 to 13, the blended amount of the epoxy resin was equal to the amount of epoxy resin blended in the dielectric material of Example 4 without taking into account the amount of epoxy groups. Thus, the higher the epoxy equivalent was, the smaller the amount of epoxy groupswas. As a result, the dielectric materials of Examples 11 to 13 having higher epoxy equivalent of the epoxy resin blended therein exhibited a smaller effect of improving dielectric breakdown properties and a smaller effect of increasing durability at high temperature than the dielectric material of Example 4.

A transducer including the dielectric material according to the present invention can be widely used for actuators, sensors and the like that perform the conversion between mechanical energy and electric energy, and for speakers, microphones, noise cancellers and the like that perform the conversion between acoustic energy and electric energy. The dielectric material according to the present invention is particularly suitable for artificial muscles used in industrial robots, medical robots, welfare robots, assist suits or the like, small pumps for cooling electronic parts, medical use or the like, and flexible actuators used for medical devices or the like.

What is claimed is:

1. A dielectric material for a transducer, characterized in that
the dielectric material is manufactured from a composition that includes metal oxide particles having hydroxy groups, a rubber polymer having a functional group capable of reacting with an epoxy group, a bisphenol type epoxy resin excluding an alkoxysilane-modified epoxy resin, both ends of which have an epoxy group, and a cross-linking agent, and

TABLE 2

| | | | Example 4 | Example 8 | Example 9 | Example 10 | Example 11 | Example 12 | Example 13 |
|---|---|---|---|---|---|---|---|---|---|
| Raw material [parts by mass] | Rubber polymer | HX-NBR | 100 | 100 | 100 | 100 | 100 | 100 | 100 |
| | Cross-linking agent | Tetrakis (2-ethylhexyloxy) titanium | 5 | 5 | 5 | 5 | 5 | 5 | 5 |
| | Metal oxide particles | TiO$_2$ particles | 6.6 | 6.6 | 6.6 | 6.6 | 6.6 | 6.6 | 6.6 |
| | | TiO$_2$/ZrO$_2$ composite particles | 5.82 | 5.82 | 5.82 | 5.82 | 5.82 | 5.82 | 5.82 |
| | Bisphenol A type epoxy resin | Epoxy equivalent 189 g/eq | 5 | — | — | — | — | — | — |
| | | Epoxy equivalent 475 g/eq | — | 12.57 | — | — | 5 | — | — |
| | | Epoxy equivalent 720 g/eq | — | — | 19.05 | — | — | 5 | — |
| | | Epoxy equivalent 2850 g/eq | — | — | — | 75.40 | — | — | 5 |
| Film thickness [μm] | | | 8.2 | 7.0 | 6.9 | — | 7.8 | 7.6 | 7.1 |
| Evaluations | Dielectric constant (at frequency of 100 Hz) | | 11.60 | 11.10 | 10.67 | — | 11.93 | 12.26 | 12.00 |
| | Dielectric breakdown strength [V/μm] | | 140 | 130 | 130 | — | 120 | 90 | 110 |
| | Leak current [nA] | | 45 | 32 | 47 | — | 72 | 47 | 65 |
| | Volume resistivity [Ω · cm] | | 4.8 × 10$^{13}$ | 6.7 × 10$^{13}$ | 4.6 × 10$^{13}$ | — | 3.0 × 10$^{13}$ | 4.6 × 10$^{13}$ | 3.3 × 10$^{13}$ |
| | M$_{25}$ [MPa] | | 6.1 | 7.1 | 8.1 | 7.7 | 4.3 | 4.8 | 4.9 |
| | Tensile strength at break [MPa] | | 64.0 | 52.8 | 59.4 | 18.7 | 52.1 | 50.4 | 58.2 |
| | Elongation at break [%] | | 405 | 350 | 365 | 100 | 400 | 390 | 415 |
| | Energization test 80° C. 60 V/μm | No. 1 | >2 hours | — | — | — | 16 min. | 5 min. | — |
| | | No. 2 | >2 hours | — | — | — | 18 min. | 5 min. | — |
| | | No. 3 | >2 hours | — | — | — | 16 min. | 6 min. | — | the metal oxide particles are bound to the rubber polymer via the bisphenol type epoxy resin.

2. The dielectric material for a transducer according to claim 1, wherein
the metal oxide particles are produced by a hydrolysis reaction of an organometallic compound.

3. The dielectric material for a transducer according to claim 1, wherein
the bisphenol type epoxy resin has an epoxy equivalent of 160 g/eq or more and 3,000 g/eq or less.

4. The dielectric material for a transducer according to claim 1, wherein
the metal oxide particles include one or more elements selected from titanium, zirconium, and silicon.

5. The dielectric material for a transducer according to claim 1, wherein
the metal oxide particles have a median diameter of 5 nm or more and 50 nm or less.

6. The dielectric material for a transducer according to claim 1, wherein
the functional group of the rubber polymer is one or more selected from carboxy group, hydroxy group, and amino group.

7. A method for manufacturing the dielectric material for a transducer as claimed in claim 1, the method comprising the steps of:
adding a chelating agent to an organometallic compound to produce a chelate compound of the organometallic compound;
adding an organic solvent and water to the chelate compound and heating the mixture to obtain a sol of metal oxide particles produced by a hydrosis reaction of the organometallic compound;
preparing a liquid composition containing the sol of the metal oxide particles, a rubber polymer having a functional group capable of reacting with an epoxy group, a bisphenol type epoxy resin excluding an alkoxysilane-modified epoxy resin, both ends of which have an epoxy group, and a cross-linking agent; and
applying the liquid composition to a substrate and curing a coating film.

8. A transducer characterized by comprising:
a dielectric layer made of the dielectric material for a transducer as claimed in claim 1; and
a plurality of electrodes arranged with the dielectric layer interposed therebetween.

9. The dielectric material for a transducer according to claim 1, wherein
an epoxy equivalent of the bisphenol type epoxy resin is 160 g/eq or more and 189 g/eq or less.

10. The dielectric material for a transducer according to claim 1, wherein
a blended amount of the bisphenol type epoxy resin in the composition is 1 part by mass or more and 3.5 parts by mass or less with respect to 100 parts by mass of the rubber polymer.

11. The electric material for a transducer according to claim 1, wherein
one of the two epoxy groups at both ends of the bisphenol type epoxy resin is bound to the rubber polymer, and the other is bound to the metal oxide particle.

* * * * *